Feb. 11, 1969 R. E. BERNERT ETAL 3,427,391
COMPOSITE SUPERCONDUCTIVE CONDUCTOR
Filed Sept. 20, 1967

ROBERT E. BERNERT
ALBERT M. HATCH
ZDENEK J. J. STEKLEY
INVENTORS

BY Charles M. Hogan
Melvin E. Frederick
ATTORNEYS

United States Patent Office 3,427,391

Patented Feb. 11, 1969

3,427,391

COMPOSITE SUPERCONDUCTIVE CONDUCTOR

Robert E. Bernert, Boxford, Albert M. Hatch, Marblehead, and Zdenek J. J. Stekly, Topsfield, Mass., assignors to Avco Corporation, Cincinnati, Ohio, a corporation of Delaware Filed Sept. 20, 1967, Ser. No. 669,123
U.S. Cl. 174—15 10 Claims
Int. Cl. H01b 7/34, 9/06, 5/00

ABSTRACT OF THE DISCLOSURE

A composite superconductive conductor comprised of two ribbons of metal bonded together. Superconductive wires are embedded in the metal ribbons. The ribbons have passages for cooling the composite.

The present invention relates to composite metal electrical conductors and more particularly to superconductive electrical conductors comprising a superconductive material and a ribbon of electrically conductive normal metal.

In the fabrication of superconductive coils, the characteristics of such coils can be greatly improved by providing the electrical conductor in the form of a stabilized superconductor comprising a flat ribbon of low resistance normal metal in good thermal and electrical contact with superconductive material extending the length of the ribbon. As used herein, the term "stabilized superconductor" means one which in the presence of adequate cooling assures that the conductor returns to the superconducting state following a disturbance, either self-generated (such as a flux jump) or externally generated (vibration, rapid external field change, temporary excess in current, etc.) without requiring a substantial reduction in excitation current.

In a magnet coil formed of superconducting wire alone (an unstabilized superconductor), if for any reason any part of the wire loses its superconducting characteristics and becomes normal, such as, for example, it reaches a temperature above its critical temperature, its critical current is exceeded, etc., the resistance introduced thereby not only destroys the superconducting mode of operation requiring at the least substantial shutdown of the coil, but also creates forces which may destroy the coil. By way of comparison, a coil comprising a stabilized superconductor is not subject to the above-noted defects and/or disadvantages. In addition to the above, a stabilized superconductor forming a coil can carry a current substantially equal to its short sample current without any adverse effects, whereas an unstabilized superconductor forming a coil can only carry a current which is substantially less than its short sample current. The short sample current referred to immediately hereinabove is the maximum current which a short sample of the superconductor will carry in the maximum magnetic field of the coil without going normal.

In one useful application, a stabilized superconductor comprised a plurality of superconductive wires 10 mils in diameter embedded in a copper ribbon. In another useful application, a stabilized superconductor comprised a ribbon of superconductive material bonded between two copper ribbons in a sandwich construction.

If a composite conductor as described immediately hereinabove is cooled enough, no voltage will appear in the conductor until the critical current has been reached and above the critical current, the voltage across the conductor will rise gradually with the current. Upon lowering the current, this voltage will disappear at the critical current.

If the composite conductor is not adequately cooled, a different situation exists. Consider first the case of an inadequately cooled composite superconductor that is not subject to instabilities or disturbances. In this case, no voltage appears until the current reaches the critical value. At this point, a sudden voltage will appear with the appearance in the circuit of a sizeable resistance. If the current is now lowered, a voltage persists across the conductor until a current much lower than that of the critical current is reached and the superconductor again becomes superconducting. This current can be referred to as the recovery current and depends on the degree to which the conductor is cooled. If this same composite conductor is subjected to disturbances or instabilities, then the situation is a little different. The disturbances are a destabilizing effect, and at currents above the recovery current and below the critical current the voltage across the conductor may be double valued. The magnitude of the voltage depends on which of the voltage values the coil will operate. However, it takes only one large disturbance to shift the operation from fully superconducting to fully normal. Thereafter, the current must be reduced to the value of the recovery current as determined by the degree of cooling present before superconductive operation is again attained.

It will now be seen that the normal material used in a stabilized superconductor should have as low a resistivity as possible consistent with ease of providing good electrical and thermal contact between the superconducting material and the normal material, and that particularly, the rate of removal of heat from the conductor should be sufficient to provide a recovery current not substantially less than the critical current of the conductor. Thus, the recovery current of a stabilized superconductor can be used as a measure of its degree of stabilization; the closer the recovery current to the critical current, the greater the degree of stabilization.

It is the principal object of the present invention to provide an improved superconductor.

Another object of the present invention is to provide a composite superconductor having improved heat transfer characteristics.

Another object of the present invention is to provide a superconductor which facilitates its formation into a magnet coil.

Another object of the present invention is to provide a stabilized superconductor having increased exposure to the superconducting environment when formed into a magnet coil.

A further object of the present invention is to provide a stabilized superconductor which automatically provides coolant passages when wound into a magnet coil.

A still further object of the present invention is to provide a stabilized superconductor which not only automatically provides coolant passages when wound into a magnet coil but which is resistant to compressive and tensile forces.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

Figure 1:
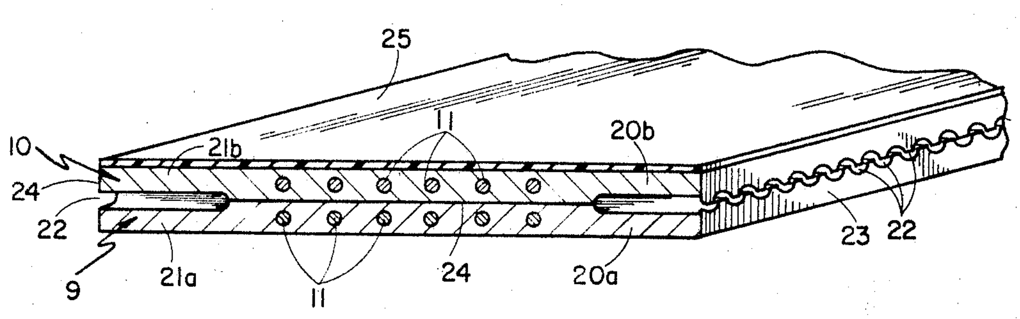
FIGURE 1 is a perspective view on a greatly enlarged scale to facilitate illustration of a stabilized superconductive conductor in accordance with one embodiment of the invention.

Referring now to FIGURE 1, there is shown a composite superconductor comprising a first normal metal strip 9, a second normal metal strip 10, and a plurality of laterally spaced wire 11 comprised of a superconductive material embedded in each metal strip 9 and 10. The metal strips 9 and 10 may be comprised, for example, of copper and the superconductive wires 11 may be comprised of any suitable superconductive material, such as, for example, niobium-titanium. The wires may be embedded in the metal strip by disposing them in corresponding lateral grooves (not shown) and then enfolding the upper portions of these grooves as by rolling with a suitable die to mechanically embed and lock the superconductive wires in the metal strip as shown in FIGURE 1. Alternately, each strip and its associated wires may be formed substantially as shown by utilizing drawing and/or rolling techniques. In this case, the wires, while being embedded in the strips, will not necessarily be evenly spaced as shown. In any event, the manner in which each flat strip and its superconductive wires are formed is not critical to the invention.

In order to understand the small size of the composite superconductor which may be used, the metal strip may have a width between its minor side surfaces of 0.50 inch and a thickness of 0.040 inch between its major side surfaces.

In large superconducting magnets of the stabilized type, the conductor should have as great an amount as possible of surface exposed to the coolant and at the same time be structurally adequate and easy to fabricate. In such large magnets, relatively large and rugged conductors are generally desirable. However, to date, most pancake type windings made with strip or ribbon type conductors have been limited by the requirement that only the strip edges are exposed to the coolant. Accordingly, to provide extended surface area in communication with the coolant, the strips of normal material in accordance with this invention may extend transversely beyond the outermost superconductive wires as shown in FIGURE 1.

Directing attention now particularly to FIGURE 1, it will be seen that the inner and oppositely disposed surfaces of the marginal portions 20*a*, 20*b*, 21*a* and 21*b* of each strip are provided with a plurality of spaced grooves 22 extending from the outermost opposite edges 23 and 24 to a point adjacent the superconducting wires. The grooves 22 in the uppermost strip as shown in FIGURE 1 are displaced or offset with respect to the grooves 22 in the lower strip to provide a continuous and substantially sinuous recess extending the length of the conductor. Accordingly, coolant may enter the sinuous recess defined by grooves 22 on each side of the conductor.

The oppositely disposed strips 9 and 10 are bonded together as by soldering at 24 and insulation 25 such as Mylar may be provided as shown to prevent turn to turn short circuits.

Figure 2:
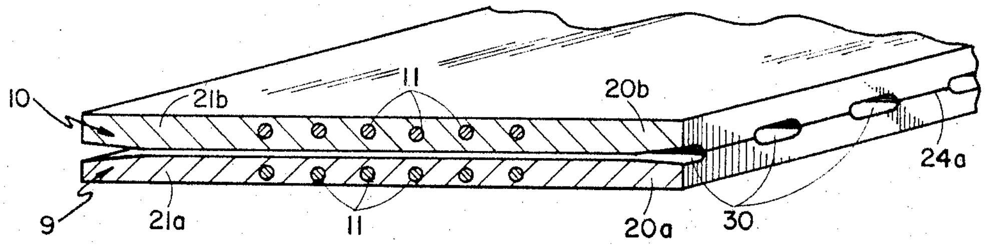
FIGURE 2 is a perspective view on a greatly enlarged scale of a stabilized superconductive conductor in accordance with another embodiment of the invention.

The embodiment shown in FIGURE 2 is substantially identical to that shown in FIGURE 1 with the exception that spaced transverse passages 30 extending through the conductor are provided rather than two recesses as shown in FIGURE 1. If desired, the superconductive wires 11 may be incorporated throughout substantially the full width of the normal material. In the FIGURE 2 embodiment the strips may be soldered together at the portions 24*a* intermediate each passage 30. In assembling the strips as shown in FIGURE 2, the transverse grooves in each strip are arranged in oppositely disposed relationship before the strips are bonded together, whereas in the FIGURE 1 embodiment the recesses are preferably offset as shown.

Figure 3:
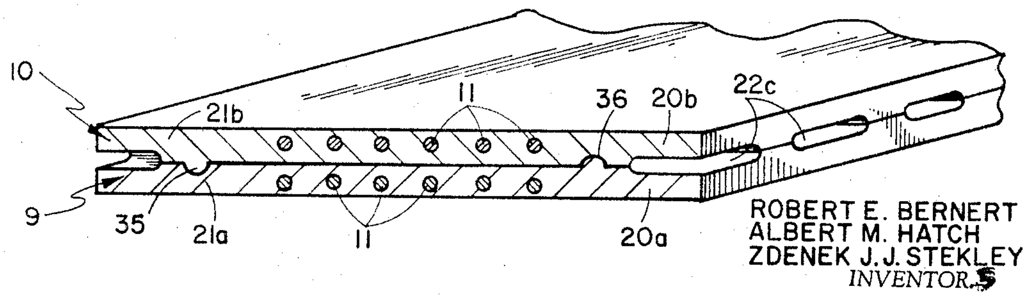
FIGURE 3 is a perspective view on a greatly enlarged scale of a superconductive conductor in accordance with a further embodiment of the invention.

FIGURE 3 shows a further embodiment similar to that shown in FIGURE 1 but adapted to facilitate ease of bending around small radii. To accomplish this, grooves 22*c* are provided in each strip to form the transversely disposed recesses as shown in FIGURE 3 or alternately, as shown in FIGURE 1, for example. Intermediate the aforementioned grooves 22*c* and preferably the outermost superconductive wires are provided at least one longitudinal projection or lip 35 in one strip adapted to be received by and fit into a corresponding longitudinal groove 36 in the other strip. These longitudinal grooves and lips prevent transverse movement of one strip with respect to the other and mechanically lock the two strips together. The oppositely disposed strips in this case are not bonded so that they may slip longitudinally with respect to each other as required. It is this slipping feature and mechanical engagement of the strips rather than bonding that provides the aforementioned improved bending characteristics.

It will now be seen that the invention provides a composite superconductive conductor having increased performance and cooling characteristics as well as being easily adaptable to simple and economical manufacturing techniques. Further, if a mechanical embedding technique is used to embed the superconductive wires in the strip by clinching in grooves or the like before mating of the strips, after the strips have been mated the composite conductor in accordance with the invention exhibits smooth external surfaces which are advantageous for purposes of providing insulation. Further, if the conductor has superconductive wires, these wires are near the neutral axis of the conductor for maximum protection.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

We claim:

1. A composite superconductive conductor comprising:

(a) first and second elongated flat ribbons of normal material in intimate oppositely disposed face-to-face contact, said normal material having a resistivity at room temperature not substantially greater than that of aluminum at room temperature, the width dimension of each ribbon being substantially greater than its thickness dimension; and (b) superconductive material disposed intermediate the edges of, extending the length of and in intimate thermal and electrical contact with at least one of said ribbons, said first and second ribbons extending in their width direction substantially past said superconductive material to define a marginal side portion including respectively each edge of said first and second ribbons, each said marginal portion having a plurality of successive grooves extending from each edge inwardly toward said superconductive material.

2. The combination as defined in claim 1 wherein the grooves in said first ribbon are offset with respect to the grooves in said second ribbon to define a continuous substantially sinuous recess along each edge of said conductor.

3. The combination as defined in claim 2 wherein said first and second ribbons are bonded one to another.

4. The combination as defined in claim 1 wherein said first ribbon is provided with a longitudinal lip and said second ribbon is provided with a longitudinal groove to receive said lip to prevent transverse movement of said ribbons with respect to each other.

5. The combination as defined in claim 1 wherein the grooves in said first and second ribbons are oppositely disposed to each other to define a plurality of successive passages extending at least to a point adjacent said superconductive material.

6. The combination as defined in claim 5 wherein said passages extend transversely through said conductor.

7. The combination as defined in claim 1 wherein said grooves extend at an angle other than 90° toward said superconductive material.

8. A composite superconductive conductor comprising:

(a) first and second flat elongated ribbons of normal material in intimate oppositely disposed face-to-face contact, said normal material having a resistivity at room temperature not substantially greater than that of aluminum at room temperature, the width dimension of each ribbon being substantially greater than its thickness dimension; and (b) superconductive material embedded in each of said ribbons intermediate the edges thereof and extending the length of and in intimate thermal and electrical contact with said ribbons, said first and second ribbons extending in their width direction substantially past said superconductive material to define a marginal portion including respectively each edge of said first and second ribbons, the inner surface of each said marginal portion having a plurality of successive grooves extending from each edge inwardly toward said superconductive material.

9. The combination as defined in claim 8 wherein said grooves extend inwardly to a point adjacent said superconductive material.

10. The combination as defined in claim 8 wherein each ribbon includes means for mechanically preventing transverse motion of said ribbons with respect to each other and maintaining them in said face-to-face contact.

References Cited

UNITED STATES PATENTS

| | | | |
|---|---|---|---|
| 3,349,209 | 10/1967 | Zar | 335—216 |
| 3,372,470 | 3/1968 | Bindari. | |

LEWIS H. MYERS, *Primary Examiner.*

ELLIOT A. GOLDBERG, *Assistant Examiner.*

U.S. Cl. X.R.

174—126; 335—216